US008548962B2

(12) United States Patent
Tapply et al.

(10) Patent No.: US 8,548,962 B2
(45) Date of Patent: Oct. 1, 2013

(54) DATA COMPRESSION AND DECOMPRESSION USING RELATIVE AND ABSOLUTE DELTA VALUES

(75) Inventors: Joe D. Tapply, Great Wilbraham (GB); Eivind Liland, Berlin (DE); Sean T. Ellis, Farnham (GB)

(73) Assignee: ARM Limited, Cambridge (GB)

( * ) Notice: Subject to any disclaimer, the term of this patent is extended or adjusted under 35 U.S.C. 154(b) by 18 days.

(21) Appl. No.: 13/137,432

(22) Filed: Aug. 15, 2011

(65) Prior Publication Data

US 2012/0059804 A1  Mar. 8, 2012

(30) Foreign Application Priority Data

Sep. 3, 2010 (GB) .................................. 1014625.6

(51) Int. Cl.
*G06F 17/30* (2006.01)
(52) U.S. Cl.
USPC ................... 707/693; 704/501; 704/E19.048
(58) Field of Classification Search
CPC ............... H03M 7/30; G06F 17/30067; G06F 17/30595
USPC .......... 707/693, 999.001, 999.203; 704/501, 704/E19.048
See application file for complete search history.

(56) References Cited

U.S. PATENT DOCUMENTS

| 5,724,033 | A | * | 3/1998 | Burrows ........................ 341/76 |
|---|---|---|---|---|
| 5,812,185 | A | * | 9/1998 | Mizuno et al. ............. 348/14.13 |
| 5,832,490 | A | * | 11/1998 | Riley .................................... 1/1 |
| 5,867,167 | A | * | 2/1999 | Deering ........................ 345/419 |
| 6,523,102 | B1 | * | 2/2003 | Dye et al. ....................... 711/170 |
| 6,719,689 | B2 | * | 4/2004 | Munneke et al. ............. 600/300 |
| 6,748,520 | B1 | * | 6/2004 | Maynard et al. .............. 712/220 |
| 6,879,634 | B1 | * | 4/2005 | Oz et al. ................... 375/240.26 |
| 7,061,936 | B2 | * | 6/2006 | Yoshimura et al. ........... 370/474 |
| 7,231,456 | B1 | * | 6/2007 | Chiba et al. ................... 709/236 |
| 7,283,265 | B2 | * | 10/2007 | Trelewicz .................... 358/1.15 |
| 7,549,122 | B2 | * | 6/2009 | Miller et al. .................. 715/716 |
| 7,623,554 | B2 | * | 11/2009 | Chuberre et al. ............. 370/535 |
| 7,650,033 | B2 | * | 1/2010 | Napper ......................... 382/186 |

(Continued)

OTHER PUBLICATIONS

Burns et al., "Efficient Distributed Backup with Delta Compression", In Proceedings of the Fifth Workshop on I/O in Parallel and Distributed Systems, Nov. 1997, 11 pages, accessed online at <http://www.almaden.ibm.com/projects/data/storagesystems/iopads97.pdf> on Nov. 15, 2012.*

(Continued)

*Primary Examiner* — Phuong Thao Cao
(74) *Attorney, Agent, or Firm* — Nixon & Vanderhye P.C.

(57) ABSTRACT

A data compressor has a delta value calculator which receives data items and determines if a related data item to a received data item is stored in a data store. If the related item is stored, the delta value calculator retrieves the related data item from the data store and calculates a delta value from the received data item and the related data item. If the related item is not stored, then the delta value is calculated from the received data item and a predetermined value. A data store controller accesses the data store in response to receipt of a data item and determines if a storage location is allocated to the data item. If there is an allocated storage location for the data item, the data item is stored in the allocated storage location; and if not then a storage location is allocated to the data item.

21 Claims, 7 Drawing Sheets

(56) References Cited

U.S. PATENT DOCUMENTS

| | | | |
|---|---|---|---|
| 7,835,439 B2* | 11/2010 | Witt | 375/240.13 |
| 7,860,843 B2* | 12/2010 | Dodd et al. | 707/693 |
| 8,014,614 B2* | 9/2011 | Cook | 382/232 |
| 8,362,931 B2* | 1/2013 | Hunt et al. | 341/76 |
| 8,412,848 B2* | 4/2013 | Therrien et al. | 709/247 |
| 8,447,740 B1* | 5/2013 | Huang et al. | 707/692 |
| 2002/0116515 A1* | 8/2002 | Hashimoto | 709/230 |
| 2003/0031467 A1* | 2/2003 | Ando et al. | 386/95 |
| 2003/0090740 A1* | 5/2003 | Trelewicz | 358/426.13 |
| 2003/0151759 A1* | 8/2003 | Suzuki et al. | 358/1.13 |
| 2004/0005005 A1* | 1/2004 | McIntyre et al. | 375/240.19 |
| 2005/0047504 A1* | 3/2005 | Sung et al. | 375/240.2 |
| 2005/0066352 A1* | 3/2005 | Herley | 725/19 |
| 2005/0114408 A1* | 5/2005 | Gold et al. | 707/203 |
| 2005/0144186 A1* | 6/2005 | Hesselink et al. | 707/101 |
| 2005/0180643 A1* | 8/2005 | Okada | 382/232 |
| 2006/0106597 A1* | 5/2006 | Stein | 704/203 |
| 2006/0123035 A1* | 6/2006 | Ivie | 707/101 |
| 2006/0161963 A1* | 7/2006 | Hong et al. | 725/134 |
| 2006/0227250 A1* | 10/2006 | Barbieri | 348/700 |
| 2006/0230353 A1* | 10/2006 | Miller et al. | 715/700 |
| 2006/0244840 A1* | 11/2006 | Eshet et al. | 348/222.1 |
| 2007/0030805 A1* | 2/2007 | Pantelias et al. | 370/235 |
| 2007/0044128 A1* | 2/2007 | Witt | 725/90 |
| 2007/0223373 A1* | 9/2007 | Sato et al. | 370/229 |
| 2007/0274382 A1* | 11/2007 | Hickey et al. | 375/240.03 |
| 2008/0034268 A1* | 2/2008 | Dodd et al. | 714/755 |
| 2008/0129748 A1* | 6/2008 | Bakalash et al. | 345/505 |
| 2008/0154928 A1* | 6/2008 | Bashyam et al. | 707/101 |
| 2008/0162922 A1 | 7/2008 | Swartz | |
| 2008/0211812 A1* | 9/2008 | Barbu et al. | 345/424 |
| 2008/0256326 A1* | 10/2008 | Patterson et al. | 711/206 |
| 2009/0097477 A1* | 4/2009 | Zhu | 370/352 |
| 2009/0190652 A1* | 7/2009 | Kim | 375/240.01 |
| 2009/0257633 A1* | 10/2009 | Cook | 382/131 |
| 2009/0290855 A1* | 11/2009 | Kowalski et al. | 386/109 |
| 2010/0125553 A1* | 5/2010 | Huang et al. | 707/661 |
| 2010/0306412 A1* | 12/2010 | Therrien et al. | 709/247 |
| 2012/0133532 A1* | 5/2012 | Hunt et al. | 341/87 |
| 2012/0179796 A1* | 7/2012 | Nagaraj et al. | 709/223 |
| 2012/0185612 A1* | 7/2012 | Zhang et al. | 709/247 |
| 2012/0213234 A1* | 8/2012 | Zhang et al. | 370/474 |

OTHER PUBLICATIONS

Burns, R.C., "Differential Compression: A Generalized Solution for Binary Files", Dec. 1996, 69 pages, accessed online at <http://citeseerx.ist.psu.edu/viewdoc/summary?doi=10.1.1.35.7480> on May 30, 2013.*

MacDonald, J.P., "File System Support for Delta Compression", 2000, 32 pages, accessed online at <http://mail.xmailserver.net/xdfs.pdf> on May 30, 2013.*

UK Search Report dated Apr. 13, 2011 for GB 1014625.6.

"IP fragmentation" http://en.wikipedia.org/wiki/IP_fragmentation and http://en.wikipedia.org/wiki/IPv4#Fragmentation_and_reassembly, Apr. 2011.

"Video compression" http://en.wikipedia.org/wiki/Video_compression#Intraframe_versus_interframe_compression Apr. 2011.

* cited by examiner

DATA COMPRESSION AND DECOMPRESSION USING RELATIVE AND ABSOLUTE DELTA VALUES

BACKGROUND OF THE INVENTION

Field of the Invention

The present invention relates to the field of data compression and decompression in data processing.

With the increasing processing power of modern processors the amount of data that they can handle is also increasing. The transmission between different devices of this increasing amount of data presents its own problems and these have been addressed using various different compression schemes. These compression schemes allow data to be compressed into a more compact form prior to transmission and then decompressed on receipt where the data is required.

One way of compressing data is delta compression. It has been found that in streams of data representing image to be displayed, generally the difference between two adjacent data items is quite small, and thus, rather than sending each data item, it may be more efficient to simply send a first data item and then send values that represent a difference with a previous value. If the values are similar then clearly less data can be sent in this way.

However, problems can occur where graphics data for example is being transmitted in a stream, with data from different tiles of the screen occurring in any order. By its nature delta-compression is only efficient if the data items that the delta is calculated from are similar. Thus, in a graphics data stream the deltas should be calculated between related data items, for example those that are adjacent in a data set. These values may not appear in the data stream close to each other and thus, in order to calculate the delta values, a data store is required to store the previously received data items. Where there are thousands to millions of data sets that can be accessed in any order, you may not have the required related values stored unless a very large amount of previously received data is stored.

SUMMARY OF THE INVENTION

Viewed from a first aspect, the present invention provides a data compressor for receiving a data stream comprising a plurality of data items and for outputting a compressed data stream, said data compressor comprising: a data input for receiving said data stream; a delta value calculator for generating a compressed delta value, said delta value calculator being configured to receive said plurality of data items from said data input and being configured for at least some of said received data items to access a data store to determine if a related data item to said received data item is stored in said data store and: in response to said related data item being stored, to retrieve said related data item from said data store and to calculate a delta value from said received data item and said related data item and to output said delta value; and in response to said related data item not being stored in said data store to calculate a delta value from said received data item and a predetermined value and to output said delta value; a data store for storing said plurality of data items received at said data input; said data compressor further comprising: a data store controller for controlling the storage of said plurality of data items in said data store, said data store controller being configured to access said data store in response to receipt of a data item at said data input and to determine if a storage location is allocated to said data item and: if so to store said data item in said allocated storage location; and if not to allocate a storage location to said data item and to evict and discard any data stored in said allocated storage location and to store said data item in said allocated storage location.

The present invention recognises that with some data streams there may be data items received in any order, so that neighbouring values are not related to each other within a data set or object. Forming delta values between data items only works to compress the received data stream where the two data items are similar to each other and this generally occurs where they are related to each other, perhaps adjacent in a data set. However if the data stream comprises data items received in any order then neighbouring data items in the data stream will be unrelated. In order to be able to form delta values between data items that are related to each other in a data set then a data store is required to store previously received values so that when a new value is received a related value can be retrieved from the data store and the corresponding delta values calculated. However, if the data stream comprises many data items received in any order the data store would need to be very large in order to ensure that there is a related value stored.

If the data store is a data store that is quick to access such as a cache then it is expensive in area and it is not advantageous to have a very large data store. If a smaller data store is used along with cheaper memory then the latency of the system will depend on whether or not the related data item needs to be retrieved from memory and this will mean that the latency of the system is not constant but depends on the actual data item being retrieved and thus, there cannot be a constant throughput of input data.

The present invention addresses this problem by allowing a "delta value" to be calculated from a predetermined value where no related data item is stored. Thus, when a new data item is received it is determined if a related data item is stored and if it is a delta value is calculated from that related value. However if it is not, a delta value is simply calculated with respect to a predetermined stored value. This value may be a zero in which case the actual data item is output or it may be a calculated statistical average of the data items. This allows the delta value to be calculated with the same latency whether or not there is a stored related value. Thus, there can be a constant throughput of data, it is just that in some circumstances, where no related data item is stored, the data will not be compressed or will not be very much compressed.

The data store is a forgetful store, so that when a new data item is received it is determined if a storage location is allocated to it. If it is the value is stored in that location, if not another storage location is evicted and the data discarded and the new value stored there. It is possible to do this as the system is able to cope with related data items not being stored, thus, overwriting stored values will not generate an error, it may just result in compression of a future value not being so efficiently performed.

It should be noted that generally the delta value is calculated as a difference between the received data item and its related value or the predetermined value. This difference might be a simple subtraction or it may be another method of determining the dissimilarity between the two values.

In some embodiments, said plurality of data items in said data stream are each classified as belonging to one of a plurality of data objects, said data objects each comprising a plurality of data items, said data items stored in said data store comprising an identifier associated with them identifying said data object; wherein said data store controller is configured to allocate said storage locations within said data store to said data objects.

Embodiments of the present invention are particularly suitable for use with data streams having several data objects. Where there are a plurality of data objects then data items within the same data object will be related to each other, while those in other data objects will generally not be. Thus, if neighbouring data items in the data stream come from different data objects forming delta values between them will not compress the data. Thus, it is convenient if the data items can be identified as belonging to a data object and the data store allocates storage locations to the data objects. Thus, related values can be identified within the data store from these identifiers and the corresponding deltas calculated. Where the data stream has a well defined format, the data items in the data stream will not each need to have identifier bits but can be identified as belonging to a particular data object from their position in the data stream, and from a perhaps a single identifier bit for that data object.

In some embodiments, said data item and said related data item belong to a same data object, such that in response to determining said related data item is stored in said data store and retrieving said related data item for calculation of said delta value, said data store controller is configured to store said data item in said storage location allocated to said same data object and evict and discard said related data item.

In some embodiments, a storage location is allocated to a data object and thus, when a data item is received where a storage location in the data store is already allocated to that data object, then the related data item will be stored in the data store and deltas can be calculated from it, when this has been done the received data item can be stored within this allocated storage location and the stored data item can be evicted and discarded. Once a related value has been used to calculate a delta then it is not required any longer and thus, it is overwritten by the value that it is related to which will be related to a next data item received from the same data object.

In some embodiments, each of said data objects comprise a plurality of data sections, each of said data sections comprising a plurality of neighbouring data items within said data stream, said data store controller being configured to store a data section in one of said storage locations allocated to said corresponding data object.

In some embodiments, said data store controller is configured in response to receipt of a first data item of one of said data sections, to determine if a data section from a same data object is stored in a storage location in said data store such that said storage location is allocated to said data object, and: if so to calculate at least one delta value with said delta value calculator from at least one data item in said received data section and at least one related data item in said stored data section and then to evict said stored data section from said allocated storage location and to store said received data section in said allocated storage location; and if not to evict and discard data from one of said storage locations and to allocate said storage location to said data object and to store said data section in said allocated storage location.

When a new data section is received the data store controller sees if a data section from a same data object is stored in the data store and if so at least one of the data items in the data section will be used to form a delta with a corresponding data item in the received data section and the received data section will overwrite the previously stored one.

In some embodiments, the data stream comprises data sections having neighbouring data items and the data store controller stores a whole data section in each storage location that is allocated to a particular data object.

In some embodiments, for at least one of said data items said related data item comprises a data item within a same data section.

Deltas can be calculated from related data items within different data sections but the same data objects. They can also be calculated within a data section such that data items within a data section may be related and the delta value between them will be a compressed version of them.

In some embodiments, for at least one of said data items, said related data item comprises a data item from a corresponding position in a previously received data section belonging to a same data object.

A related data item can also be a corresponding data item from a same data object but a different data section. In this way, the data sections can be linked to each other and the different data items within the data sections can an also be linked by these delta values. The data can then be suitably compressed and can also be decompressed from the values received.

In some embodiments, said data items belonging to a same data object and identified by said identifier are destined for a same destination.

Although the data object may be a number of different data sets provided that they comprise data related to each other in some way, in some embodiments it is a data set that is destined for a particular destination.

In some embodiments, said at least one data stream comprises at least one stream of graphics data, said data object comprises a list of graphics commands for drawing a tile in a graphics display, said data section comprises one of said graphics command and said data item comprises a field within said graphics command.

A stream of graphics data is particularly suitable for compression by embodiments of the present invention. Graphics displays are formed from tiles, each tile being drawn using a list of graphics commands. Thus, the list of graphics commands for drawing a tile are related to each other and delta values can be formed between the lists in the same tiles and also between fields within the commands. However, forming delta values between lists in different tiles will generally not provide compression of the data. Thus, such a graphics data stream will have many data items that are related to each other and many that are not and the data items will be arranged in any order. Embodiments of the present invention use the forgetful data store and allow compression using absolute values and this allows a constant throughput of such disparate data even where a related data item is not stored.

Although the data store can be a number of things, in some embodiments it comprises a data cache. A cache is a convenient way of storing data that is quick and easy to access. It is expensive in area and therefore has a limited size, however, using a forgetful cache and allowing data items to be calculated whether or not related values are stored means that the cache of a reasonable size can be used and the compressor and still function correctly.

Where a cache is the data store then each line of the data cache has an identifying value for identifying the data object that the line is allocated to store.

In some embodiments, said data object comprises a list of graphics commands for drawing a hierarchical layer of a tile in a graphics screen; wherein said data store controller is configured in response to receipt of a first data item of one of said data sections, to determine if a data section from a same data object is stored in a storage location in said data store and in response to determining that a same data object is not stored in a storage location in said data store to identify a data object from a same tile but a different hierarchical level and to calculate at least one delta value with said delta value calculator from at least one data item in said received data section and at least one related data item in said stored data section and to output said delta value along with an indication identifying a source of said related data item.

Where the data stream comprises data for hierarchical graphic displays, then related values for forming deltas can come from different hierarchical layers of the same tile. This will result in compression but will also allow decompression as the preceding layer will always have been received at the decompressor when the delta value is received.

A second aspect of the present invention provides a data formatter comprising: an input for receiving values output by a data compressor; formatting circuitry configured to pack said output values into data packets of a fixed size, said data packets having one of a plurality of formats, each of said formats being identified by identifier bits within said data packet; and an output for outputting said data packets; wherein one of said plurality of formats comprises an extension format for extending a storage capacity of a data packet by storing a portion of an output value that is too large to store in said data packet, said formatting circuitry being responsive to receiving said output value that is too large to store in said data packet to divide said output value between said data packet and at least one further packet having said extension format and to output said data packet and said at least one extension data packet at said output.

Some data compressors, particularly the data compressor of the first aspect of the present invention are able to compress some data items particularly effectively while others are less well compressed and indeed sometimes not compressed at all. When formatting this data to transmit it further, it can be difficult to do this efficiently as the size of the data representing these data items may vary enormously. If one uses data packets of different lengths, encoding is required to indicate where the start and end of each data packet is. Alternatively constant length data packets can be used but this can result in inefficient packing of the data due to the varying length of any data sent. A packet that is large enough to accommodate the uncompressed data will have many empty spaces when transmitting the data that has been efficiently compressed. The present invention addresses this problem by providing constant data packet lengths so that no bits need to be used to indicate the lengths or the start and end of the packets. These data packets have one of a number of formats, the format being identified by identifier bits. One of the formats is an extension format so that if the storage capacity of a data packet is too small to store an output value then a portion of this value can be placed in one or more of the extension format packets. In this way, a data packet having a size which is appropriate for storing one or more compressed data items can be used then if a larger value that has not been efficiently compressed needs to be transmitted it can still be transmitted using these extension data packets.

In some embodiments, said values received comprise at least some data compressed by a delta compressor to form delta values, and said plurality of formats include: a first format comprising indicator values for indicating if a following packet comprises a delta value relative to a predetermined value or a delta value comprising data relative to a previously received data item, and at least a portion of at least one of said delta values; a second format comprising at least a portion of at least one of said delta values; and said extension format for storing a portion of said at least one delta values that are too large to store in said second format.

Embodiments of the second aspect of the present invention are particularly suited for formatting data from the compressor of the first aspect of the present invention. Thus, the data format packets are able to deal with delta values related to other data items and delta values formed by subtraction of a predetermined value. In this way, compressed data output by a compressor of a first aspect of the present invention can be stored in the constant lengths data packet and can be identified as either a delta value related to another data item or a delta value related to a predetermined value and in this way, the compressed data can be recognised by a decompressor later and can be regenerated.

In some embodiments, said indicator values for said first format provide an indication of which, previously received data item said delta value is calculated with respect to.

In some embodiments, each of said formats comprise indicator bits dedicated to store said indicator values and bits dedicated to store at least one data field, said values received each comprising data for one of said at least one data fields.

The formats comprise indicator bits indicating the particular format and then at least one data field. Each data field being used to store at least a portion of a delta value.

In some embodiments, said data formatter is configured to output data packets having said extension format immediately prior to said data packet that they extend.

The extension format packets are generally output prior to the packets that they extend. Thus, a number of extension packets can be output and when another format packet is received it is understood that these extension packets belong to that packet without any additional information being needed. Thus, no start or end indicators are required A third aspect of the present invention comprises a data compressing system comprising a data compressor according to a first aspect of the present invention coupled to a data formatter according to a second aspect of the present invention.

A fourth aspect of the present invention provides a data decompressor comprising: an input for receiving a stream of compressed data comprising a plurality of data packets of a fixed size each storing a plurality of values, said data packets having one of a plurality of formats, each of said plurality of formats being identified by identifier bits within said data packet, one of said plurality of formats comprising an extension format for storing a portion of at least one output value that is too large to store in a related data packet a data deformatter for identifying said formats of said data packets from said identifier bits and for combining data stored in at least one of said extension packets with data stored in said related data packet; a data decompressor for decompressing said data.

A fifth aspect of the present invention provides a method of compressing data comprising the steps of: receiving a stream of data comprising a plurality of data items at a data input; accessing a data store and determining if a data item related to a received data item is stored in said data store and: in response to said related data item being stored, retrieving said related data item from said data store and calculating a delta value comprising a difference between said received data item and said related data item and outputting said delta value; and in response to said related data item not being stored in said data store calculating a delta value comprising a difference between said received data item and a predetermined value and outputting said delta value; accessing said data store to determine if a storage location is allocated to said received data item and: if it is not allocating a storage location within said data store to said data item and evicting and discarding data stored in said storage location; storing said data item in said allocated storage location.

A sixth aspect of the present invention provides a method of formatting compressed data comprising: receiving values output by a data compressor; packing said output values into data packets of a fixed size, said data packets having one of a plurality of formats, each of said formats being identified by identifier bits within said data packet; and outputting said data packets; wherein one of said plurality of formats comprises an extension format for extending a storage capacity of a data packet by storing a portion of at least one output value that is too large to store in said data packet, said formatting circuitry being responsive to receiving said at least one output value that is too large to store in said data packet to divide said at least one output value between said data packet and at least one further packet having said extension format and to output said data packet and said at least one extension data packet at said output.

A seventh aspect of the present invention provides a method of compressing and formatting compressed data comprising the method according to a fifth aspect of the invention followed by the method according to a sixth aspect of the present invention.

An eighth aspect of the present invention provides a method of decompressing compressed data, comprising: receiving a stream of compressed data comprising a plurality of data packets of a fixed size each storing a plurality of values, said data packets having one of a plurality of formats, each of said plurality of formats being identified by identifier bits within said data packet, one of said plurality of formats comprising an extension format for storing a portion of at least one output value that is too large to store in a related data packet; identifying said formats of said data packets from said identifier bits; and combining data stored in at least one of said extension packets with data stored in said related data packet; and decompressing said data.

A ninth aspect of the present invention provides a computer program product which is operable when run on a data processor to control the data processor to perform the steps of the method according to a sixth, seventh or eighth aspect of the present invention.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
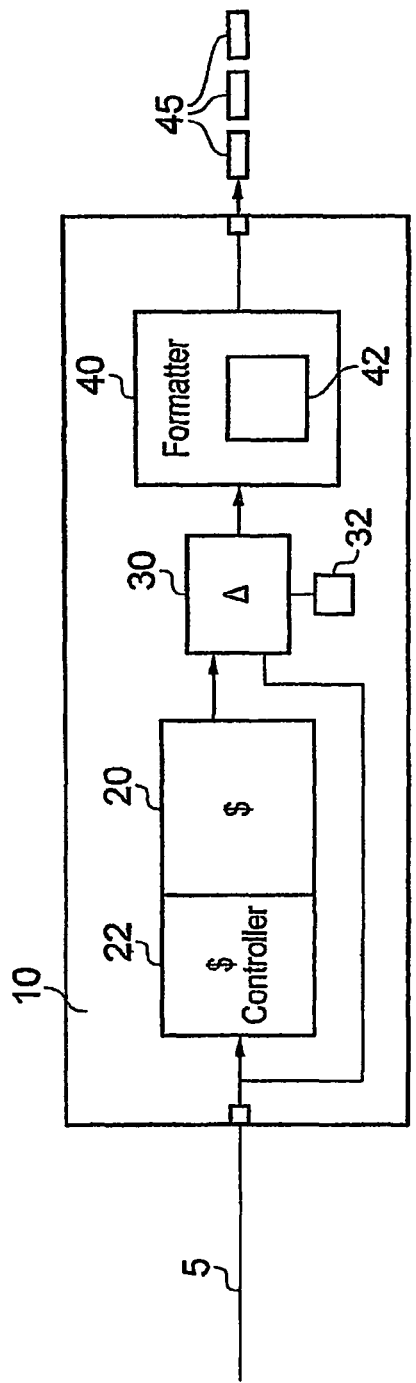
FIG. 1 shows a data compression system according to an embodiment of the present invention.

FIG. 1, shows a data compression system 10 according to an embodiment of the present invention. A stream of data 5 is received at an input to the system 10 and is then transmitted to a forgetful cache 20 which has a cache controller 22 controlling storage within the cache 20. On receipt of a data item the cache controller 22 checks to see if a related value to the data item received is stored in the cache 20 and if it is, this will be output to delta compressor 30. The cache controller 22 will then look to see if any of the storage locations within the cache 20 are allocated to this particular data item. If they are then it will store the data item in the allocated location and if not it will allocate a location to the data item and will store the data item there, possibly overwriting another data item in doing so. Selection of the data item for overwriting can be done in a number of known ways such as in a round robin fashion.

The data item is sent in parallel to the delta compressor 30 as well as to the cache 20. Thus, delta compressor 30 receives the data item and possibly a related data item if one is stored in cache 20. The delta compressor 30 compresses the received data item by calculating a difference between it and its related value or if no related value is stored between it and a predetermined value which is stored in register 32. Register 32 may store any value. It may store a 0 in which case the delta value calculated with respect to this value will actually be the uncompressed received data item or more typically it will store a statistical average value of the data items received. Thus, generally by subtracting an average value from the data item received the value output will be lower and thus take up fewer bits. The output data is then sent to data formatter 40.

Data formatter 40 has formatting circuitry 42 that looks at the compressed data items received and packs them into constant size data packets. These data packets have different formats. There is a general purpose command or packet that encodes several large but infrequently changing data fields and that has an indicator bit that can be used to indicate if subsequent data items are in absolute mode or relative mode. This indicator bit is used to indicate that the next packets contain delta values with respect to the predetermined value stored in the register 32 or that the next packets contain delta values relative to related data items. By default all commands are relative to the ones that preceded them, but the indicator bit in a general purpose command can be used to re-bias the rest of the current command to be relative to predetermined constant values. In this way, the formatter can output the differently compressed data items received in constant sized data packets. In order to be able to cope with the different sizes of these differently compressed values, there are also primitive packets which are capable of encoding an entire set of data items and extensions to these primitives which allow additional values to be stored where the values are not particularly well compressed and need additional space. In this way, the size of the data packet does not have to be large enough to take the worst case uncompressed data item but can be of a size that will take a generally well compressed data item and extension packets can be used to transmit the rest of the value(s). These different formats are described in more detail in FIG. 5.

Figure 2:
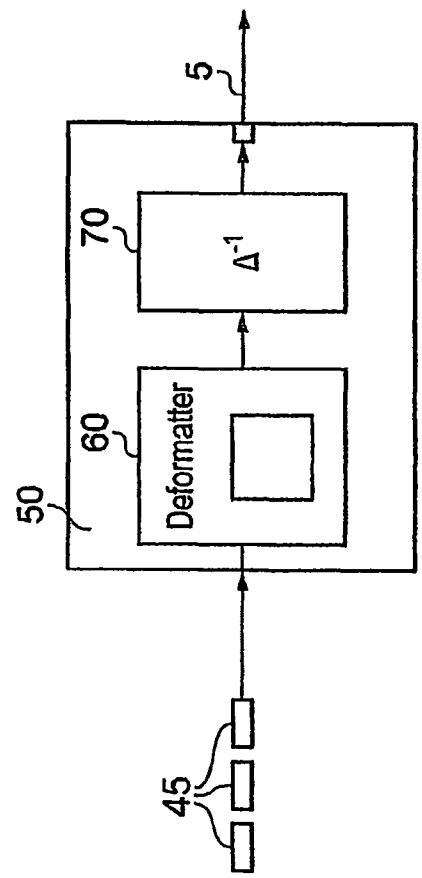
FIG. 2 shows a data decompression system according to an embodiment of the present invention.

FIG. 2 shows in schematic form a decompressing system 50 according to an embodiment of the present invention. Constant size data packets 45 are received from compression system 10 and de-formatter 60 identifies the format of each packet from the identifiers within the packet and it then combines extension packets with the packets to which they belong and re-forms the compressed data items. These are then put into de-compressor 70 which performs the calculations necessary to generate the stream of data 5 that originally entered compressing system 10.

Although the above-described decompressing system can be used for all sorts of streams of data, it is particularly useful for graphical data where there are tiles of data that are formed as command lists for drawing a particular tile. Thus, each tile has a list of commands for drawing that particular tile and each command is sent as a plurality of neighbouring data items with an identifier identifying the tile that the plurality of data items pertains to.

Figures 3, 4:
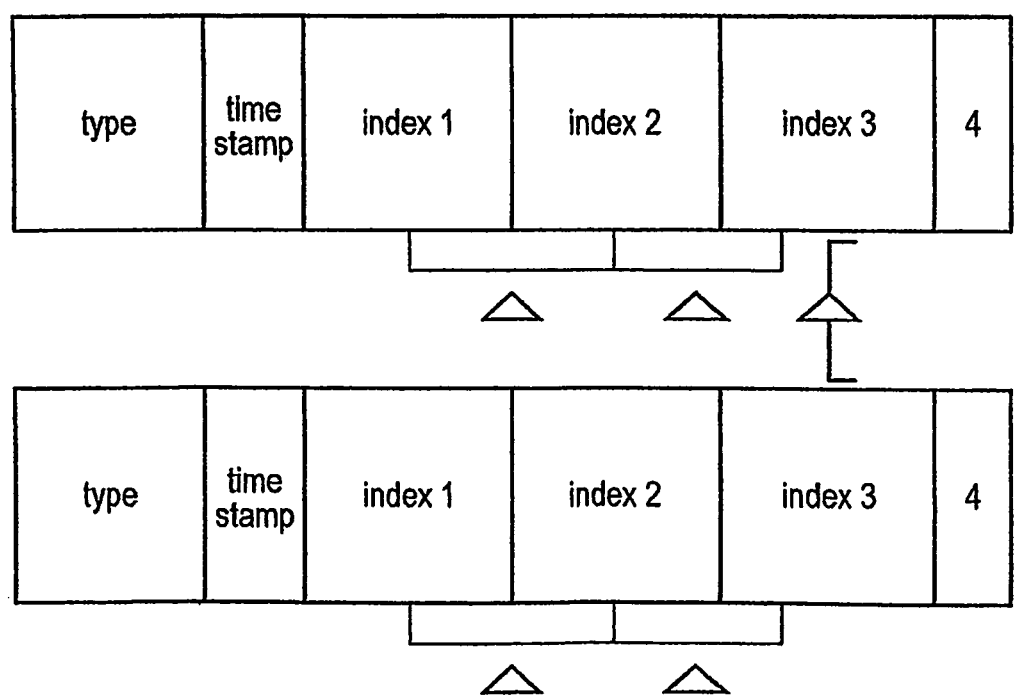
FIG. 3 shows a forgetful cache according to an embodiment of the present invention.
FIG. 4 shows a graphics command that is compressed by embodiments of the present invention.

FIG. 3 shows in more detail forgetful cache 20 of FIG. 1 storing such command data. Each line of the cache stores a graphical command. There is a data object/list identifier associated with each command in the stream which identifies the tile or list of commands that that command pertains to and these are stored in the cache as the tag associated with the data item. These list identifiers are used to confirm whether previous data items are already in the cache. In this example, each list or tile has a line allocated to it that is identified by an identifier in the tag (not shown). Thus, when a new command from that list is received the values are retrieved for suitable delta calculations and then the newly received value is stored in this line of the cache that is allocated to that particular list.

In this regard hierarchy levels could be stored explicitly as part of the tag, or the tile position and hierarchy levels could be combined mathematically into a single identifier field. Keeping the hierarchy level separate makes it easier to perform deltas between lists for the same tile but different hierarchy levels.

FIG. 4 shows in more detail the nature of such commands, thus, there may be a type field, there will be a time stamp which provides information on which commands should be executed first and there are different fields which are marked as index 1, index 2 and index 3 in the figure and these relate to different primitive commands, a primitive command may be a command for drawing a particular primitive. There is also the identifier which identifies which tile the command pertains to. FIG. 4 also shows how the different fields are combined to form deltas. In this embodiment deltas are formed between two of the fields within each command and between corresponding fields of commands from the same tile. This is an efficient way of compressing the data as within each list of commands corresponding fields are likely to reference similar vertex indices and thus, corresponding fields within the commands will be similar. Furthermore, primitives which are drawn together are likely to be of a similar size and at similar screen coordinates and are therefore likely to end up in the same lists. Primitive data sets are also often optimised by software tools and so primitives submitted together for drawings are likely to have similar vertex indices and global state that changes relatively infrequently.

Thus, in the examples shown inter-command compression and intra-command compression is used. The delta for index 3 is calculated from the index 3 of the related command retrieved from the cache 20 and the delta for index 2 is calculated with respect to index 3 and the delta for index 1 from index 2. At start up or if there is no related value stored, a delta for index 3 will be calculated with respect to the predetermined value stored in register 32 of FIG. 1.

Figure 5:
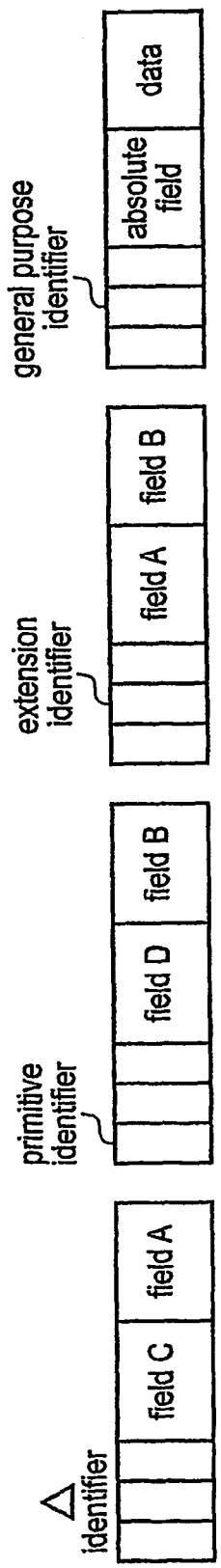
FIGS. 5 and 6 show examples of formatted compressed data packets according to an embodiment of the present invention.

FIG. 5 shows an example of some formats of the data packet output by data formatter 30. The data packets have identifiers which identify which format they are. Thus, in this particular example there is an extension identifier and a primitive identifier and a general purpose identifier, this packet being used to set up some infrequently changing global state and to indicate when the following packets are delta values with respect to a predetermined value.

Figure 6:
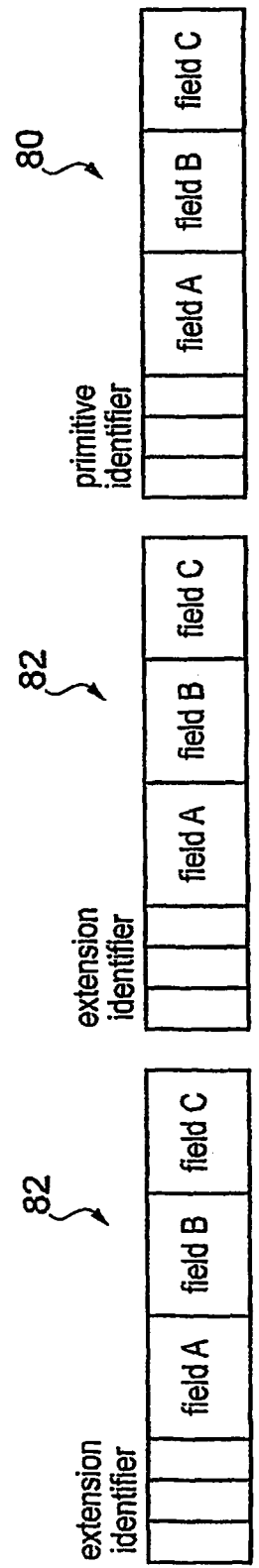

FIG. 6 shows an example compressed data stream with three data items being output, field A, field B and field C. Field C has not been well compressed, while fields A and B have been reasonably but not very well compressed. If all three values had been well compressed then they would have fitted into the single primitive packet 80. However, as this is not the case, extension packets 82 have been used to accommodate the extra bits of these fields. These extension packets have a common extension packet format and thus, require few identifier bits. The extension packets are received first and on receipt of the primitive the values are combined together.

Thus, this variable length encoding scheme uses a small number of fixed lengths compressed packets to encode the variable length data items of multiple data fields simultaneously. Specifically, it uses four types of 32 bit packets in embodiments of the invention to encode up to 198 bits per primitive. Different formats include a general purpose format that sets up some infrequently changing global state and allows the delta values in the decompressor to be optionally reset to handle the forgetfulness of the cache in the compressor, i.e. it is able to identify whether the deltas in the immediately following packets are relative deltas or whether they are deltas with respect to an absolute value.

There is also a special purpose format (not shown) which supplies the upper bits of a rarely changing wide data item and there are primitive formats which are capable of encoding an entire primitive in a single command if the compressed values are small enough.

There is also the primitive extension format which is used to extend the range of all the data fields in the primitive format.

The general purpose and special purpose formats are used quite infrequently but they do permit the efficient setting of very wide data items and also allow the delta compression to be reset arbitrarily mid-stream.

The primitive and primitive extension formats provide a novel way of efficiently encoding the most frequently changing parts of the data stream. The number of bits assigned to each field within the formats is a fixed but not necessarily an equal division of the bits available. The exact proportioning of the bits is determined by statistical analysis of a number of test data sets.

During compression, the delta values are calculated and the minimum number of bits required to encode every field is determined. If any of the fields can't be expressed in a single primitive format as many bits as possible of each field are placed into an extension format which is then output. The remaining bits in the delta values are right shifted by the number of bits that were output and then the process is repeated until all the remaining values will fit into a primitive command format which is then output.

By this process the variable length delta values of all the delta fields are broken down into none or more of these extension formats which precede a single primitive format. By outputting the most significant bits first we have removed the need to either encode a sequence termination flag for these extension formats or to specify the number of extension formats that make up the fourth command. This saves memory bandwidth and therefore power and allows a very simple hardware in both the compressor and decompressor.

It should be noted that the list identifiers are not output in the compressed commands, rather the formatter separates out the command lists into different memory address regions, which avoids the need to compress the list identifiers.

Figure 7:
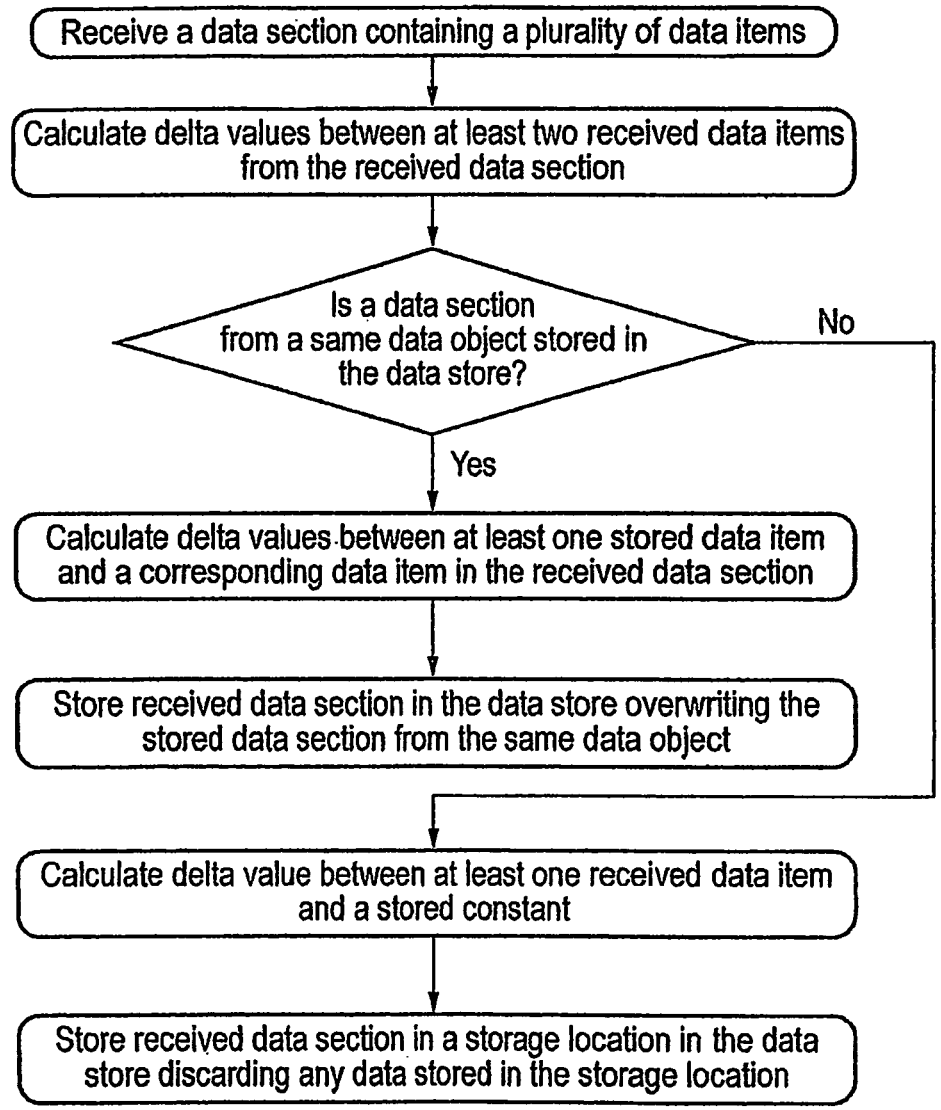
FIG. 7 shows a flow diagram illustrating a method of compressing data according to an embodiment of the present invention.

FIG. 7 shows a flow diagram illustrating a method of compressing data according to an embodiment of the present invention. A data stream is received at the data compressor and each data section containing several data items is considered in turn. Delta values between different data items within the data section are calculated and it is determined if a data section from a same data object is stored in the data store. If it is then a delta value between at least one of the stored data items and a corresponding data item in the receive data section is calculated. The received data section is then stored in the data store in the location where the data section for the same data object is currently stored. This storage location is already allocated to that data object and thus, is allocated correctly for this data section. Furthermore, if data items for this data object are required for calculating a delta value for a data section from the same data object then this newly stored section will contain the data items required.

If a data section from the same data object was not stored in the data store then a delta value is calculated between at least one of the data items in the data section and a stored constant. This step allows the data store not to store all of the previously received data items. Calculating the delta value with the stored constant will not in general provide efficient compression of the value but it does mean that a delta value can always be calculated without the need to store every received data item. The received data section is then stored in a storage location in the data store. As there are no storage locations allocated to that particular data object it overwrites one of the data sections already stored in the data store and this storage location is then allocated to this new data object. When selecting which data section to overwrite the cache controller uses one of several known routines such as determining which is the oldest data section stored in the data store.

It should be noted that although the steps are shown as being performed in this particular order in the flow diagram, they can be performed in a different order, in that the delta values within the data section may be calculated after the delta values between data sections or with respect to a constant.

Figure 8:
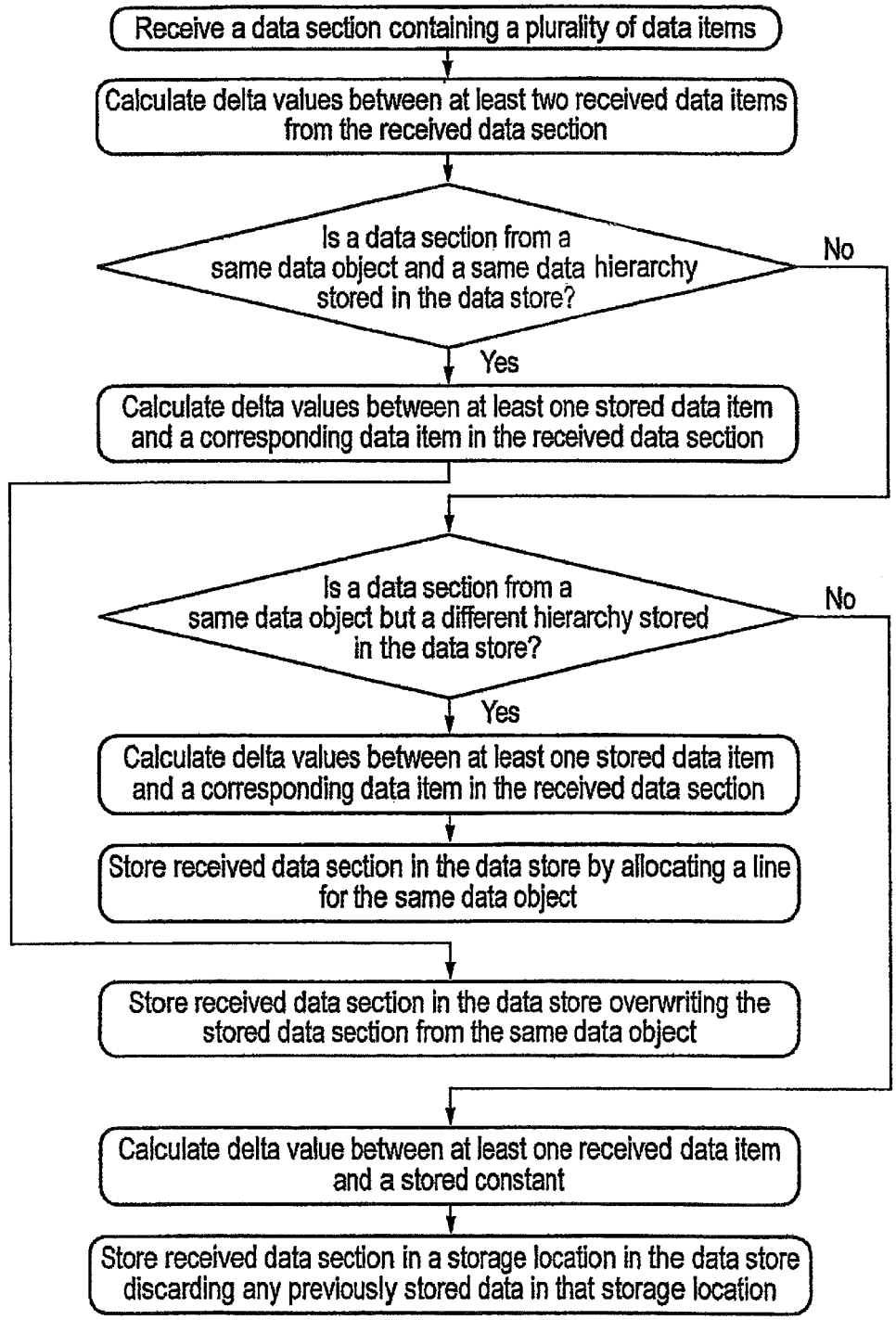
FIG. 8 shows a flow diagram illustrating a method of compressing graphical data in a hierarchical graphical graphics display according to an embodiment of the present invention.

FIG. 8 shows a flow diagram illustrating a method of compressing data for a hierarchical graphical display. A data section in the form of a graphical command for drawing a portion of a tile is received in the data stream. Delta values between at least two of the received data items are calculated and it is determined if a data section from a same data object and a same data hierarchy is stored in the data store. In other words, is there another command from the same list of commands and the same level of the graphical tile. If there is then delta values are calculated between the stored data item and a corresponding data item in the received data section. If there is not a data section from the same level and tile stored it is determined if there is a data section from a same tile but a different hierarchy level. If there is then a delta value is calculated from this stored section. It has been found that calculating delta values between corresponding data items from a same tile but different hierarchical levels does generally provide good compression and the probability of finding a previous value that one can form a delta with is increased. However, some indication needs to be output with the compressed value indicating that it is relative to another hierarchical level. If there is no command stored in the data store for that tile at all then a delta value is calculated between the received data item and a stored constant and the received command is stored in a storage location in the data store that is selected by some known method. In the case that a command from the tile of the same data hierarchy level was present in the data store then this command is overwritten by the newly received command. In the case that a command from the tile of a different data hierarchy level was present in the data store then a line is allocated to this command if there is space or a lot of lines that have not been allocated recently once the deltas have been calculated.

As for FIG. 7, the steps of the method may be performed in a different order where this is appropriate.

Figure 9:
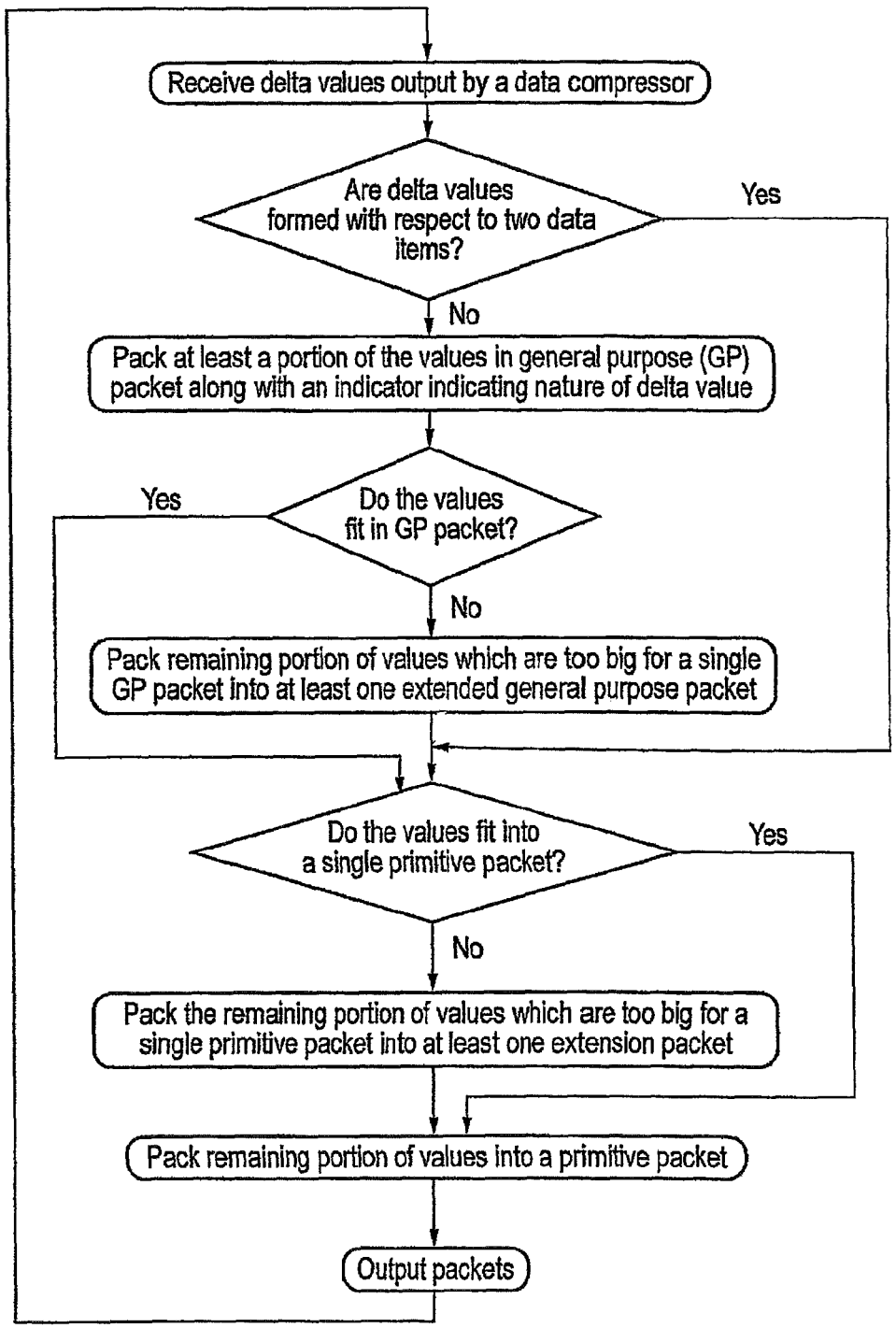
FIG. 9 shows a method of formatting data according to an embodiment of the present invention.

FIG. 9 shows a flow diagram illustrating a method of formatting compressed data into data packets according to an embodiment of the present invention. Compressed values are received and it is determined if the value(s) are delta values with respect to another data item. If they are not then a general purpose packet is used to indicate to the system that the delta values are formed with respect to a constant and to contain the received compressed value, this value and the indication are packed in this general purpose packet and if there is insufficient space in the general purpose packet into a general purpose extension packet as well. Other delta values relating to the shape are then packed into a primitive and where necessary extension packets to the primitives. These delta values may be delta values relating to other data values or some of them may be absolute values related to a constant, in the latter case an indicator in the general purpose packet will indicate this. The packets are then output as general purpose packet, extension to the general purpose packet (if an extension is required) extension(s) to the primitive packet (if an extension is required) and primitive packet which indicates the end of the command bundle for that shape.

If the values are delta values formed with respect to another data value then it is determined if these values will fit in a primitive data packet. If they will then they are packed into this primitive data packet and output. If not, they are packed into at least one primitive data packet extension and a primitive data packet and the extension packet(s) and then the primitive data packet are output. The output of the primitive packet indicates the end of the data for a command bundle. Further values that are received are then considered.

Thus, the general purpose packet provides an indication that delta values are formed with respect to a constant and in the absence of such a packet all delta values are assumed to be delta values with respect to another data value.

Figure 10:
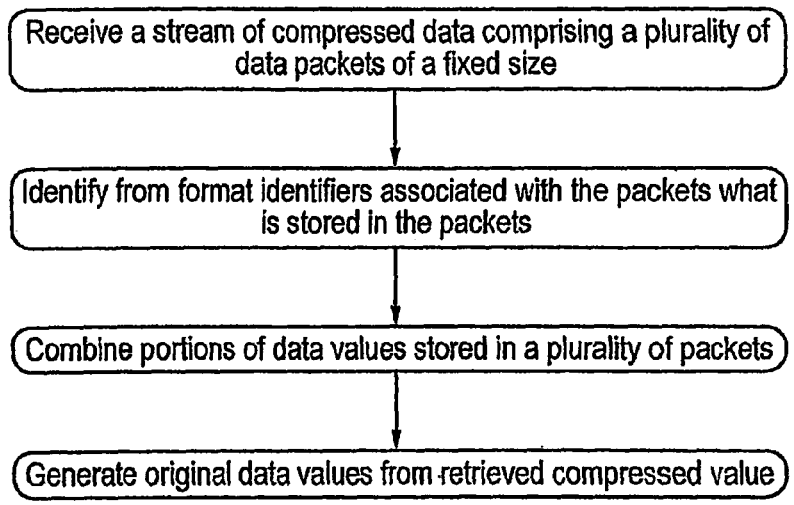
FIG. 10 shows a method of decompressing data according to an embodiment of the present invention.

FIG. 10 shows a flow diagram illustrating a method of decompressing data according to an embodiment of the present invention. Initially a stream of compressed data comprising a plurality of data packets of a fixed size is received. Each packet is analysed and the format of the packet is identified from format identifiers that were within the packet and it is then determined exactly what data items are stored in the data packets. Different portions of data items may be stored in a plurality of packets and these are combined to form the compressed data items. It is then determined which other delta values or absolute values they are related to and they are then decompressed to generate the original data items.

Various further aspects and features of the present invention are defined in the appended claims. Various modifications can be made to the embodiments herein before described without departing from the scope of the present invention.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A data compressor for receiving a data stream comprising a plurality of data items and for outputting a compressed data stream, said data compressor comprising:
   a data input for receiving said data stream;
   a delta value calculating circuitry configured to generate a compressed delta value, said delta value calculating circuitry configured to receive said plurality of data items from said data input and, for at least some of said received data items, to access a data store and determine if a related data item to a received data item is stored in said data store and said delta value calculating circuitry, in response to said related data item stored in said data store, configured to retrieve said related data item from said data store and to calculate a delta value from said received data item and said related data item and to output said delta value; and said delta value calculating circuitry, in response to said related data item not stored in said data store, configured to calculate a delta value from said received data item and a predetermined value and to output said delta value;
   said data store for storing said plurality of data items received at said data input;
   a data store controller circuitry configured to store said plurality of data items in said data store, said data store controller circuitry further configured to access said data store in response to receipt of a data item at said data input and to determine if a storage location is allocated to said data item and:
   if a storage location is allocated to said data item, to store said data item in said allocated storage location; and
   if a storage location is not allocated to said data item, to allocate a storage location to said data item and to evict and discard any data stored in said allocated storage location and to store said data item in said allocated storage location, wherein said plurality of data items in said data stream are each classified as belonging to one of a plurality of data objects, said data objects each comprising a plurality of data items, said data items stored in said data store comprising an identifier identifying said data object; wherein
   said data store controller circuitry is configured to allocate storage locations within said data store to said data objects, wherein said received data item and said related data item belong to a same data object, and, in response to determining said related data item is stored in said data store and retrieving said related data item for calculation of said delta value, said data store controller circuitry is configured to store said received data item in said storage location allocated to said same data object and evict and discard said related data item.

2. A data compressor according to claim 1, wherein each of said data objects comprise a plurality of data sections, each of said plurality of data sections comprising a plurality of neighbouring data items within said data stream, said data store controller circuitry configured to store a data section in one of said storage locations allocated to said corresponding data object.

3. A data compressor according to claim 2, wherein for at least one of said data items, a corresponding related data item comprises a data item within a same data section.

4. A data compressor according to claim 2, wherein for at least one of said data items, a corresponding related data item comprises a data item from a corresponding position in a previously received data section belonging to a same data object.

5. A data compressor according to claim 4, wherein said data store controller circuitry is configured to determine, in response to receipt of a first data item of one of said data sections, if a data section from a same data object is stored in a storage location in said data store such that said storage location is allocated to said data object, and:
   if a data section from a same data object is stored in a storage location in said data store, to calculate at least one delta value with said delta value calculating circuitry from at least one data item in said received data section and at least one related data item in said stored data section and then to evict said stored data section from said allocated storage location and to store said received data section in said allocated storage location; and
   if a data section from a same data object is not stored in a storage location in said data store, to evict and discard data from one of said storage locations, to allocate said one of said storage locations to said data object and to store said received data section in said allocated one of said storage locations.

6. A data compressor according to claim 1, wherein said data items belonging to a same data object and identified by said identifier are destined for a same destination.

7. A data compressor according to claim 2, wherein said data stream comprises at least one stream of graphics data, said data objects each comprises a list of graphics commands for drawing a tile in a graphics display, said data sections each comprises one of said graphics commands and said data items each comprises a field within said graphics commands.

8. A data compressor according to claim 1, said data store comprising a data cache.

9. A data compressor according to claim 1, said data store comprising a data cache and wherein each line of said data cache comprises a store for storing an identifying value for identifying a data object that said line is allocated to store.

10. A data compressor according to claim 9, wherein each of said data objects comprise a plurality of data sections, each of said data sections comprising a plurality of neighbouring data items within said data stream, said data store controller circuitry configured to store a data section in one of said storage locations allocated to said corresponding data object; and
   for at least one of said data items, said related data item comprises a data item from a corresponding position in a previously received data section belonging to a same data object; and
   said data object comprises a list of graphics commands for drawing a hierarchical layer of a tile in a graphics screen; wherein said data store controller circuitry is configured to determine, in response to receipt of a first data item of one of said data sections, if a data section from a same data object is stored in a storage location in said data store and, in response to determining that a data section from a same data object is not stored in a storage location in said data store, to identify a data section from a same tile but a different hierarchical level and to calculate at least one delta value with said delta value calculating circuitry from at least one data item in said received data section and at least one related data item in said stored data section and to output said delta value along with an indication identifying a source of said related data item.

11. A data formatter comprising:
   an input for receiving values output by a data compressor;
   formatting circuitry configured to pack said output values into data packets of a fixed size, said data packets having one of a plurality of formats, each of said formats identified by identifier bits within said data packets; and an output for outputting said data packets; wherein
one of said plurality of formats comprises an extension format for extending a storage capacity of a data packet by storing a portion of an output value that is too large to store in said data packet, said formatting circuitry being responsive to receiving said output value that is too large to store in said data packet to divide said output value between said data packet and at least one further packet having said extension format and to output said data packet and said at least one further packet having said extension format at said output, wherein said data formatter is configured to output data packets having said extension format immediately prior to said data packet that they extend.

12. A data formatter according to claim 11, wherein said received values comprise at least some data compressed by a delta compressor to form delta values, and said plurality of formats include:
a first format comprising indicator values for indicating if a following packet comprises delta values relative to a predetermined value or delta values comprising data relative to a previously received data item, and at least a portion of at least one of said delta values;
a second format comprising at least a portion of at least one of said delta values; and
said extension format for storing a portion of said at least one of said delta values that are too large to store in said second format.

13. A data formatter according to claim 12, wherein said indicator values for said first format provide an indication of which previously received data item said delta value is calculated with respect to.

14. A data formatter according to claim 12, wherein each of said formats comprise indicator bits dedicated to store said indicator values and bits dedicated to store at least one data field, said received values each comprising data for one of said at least one data field.

15. A data compressing system comprising a data compressor for receiving a data stream comprising a plurality of data items and for outputting a compressed data stream, and a data formatter coupled to said data compressor, said data compressor comprising:
a data input for receiving said data stream;
a delta value calculating circuitry configured to generate a compressed delta value, said delta value calculating circuitry configured to receive said plurality of data items from said data input and, for at least some of said received data items, to access a data store and determine if a related data item to a received data item is stored in said data store and said delta value calculating circuitry, in response to said related data item stored in said data store, configured to retrieve said related data item from said data store and to calculate a delta value from said received data item and said related data item and to output said delta value; and said delta value calculating circuitry, in response to said related data item not stored in said data store, configured to calculate a delta value from said received data item and a predetermined value and to output said delta value;
said data store for storing said plurality of data items received at said data input;
a data store controller circuitry configured to store said plurality of data items in said data store, said data store controller circuitry further configured to access said data store in response to receipt of a data item at said data input and to determine if a storage location is allocated to said data item and:

if a storage location is allocated to said data item, to store said data item in said allocated storage location; and
if a storage location is not allocated to said data item, to allocate a storage location to said data item and to evict and discard any data stored in said allocated storage location and to store said data item in said allocated storage location, wherein said plurality of data items in said data stream are each classified as belonging to one of a plurality of data objects, said data objects each comprising a plurality of data items, said data items stored in said data store comprising an identifier identifying said data object; wherein
said data store controller circuitry is configured to allocate storage locations within said data store to said data objects, wherein said received data item and said related data item belong to a same data object, and, in response to determining said related data item is stored in said data store and retrieving said related data item for calculation of said delta value, said data store controller circuitry is configured to store said received data item in said storage location allocated to said same data object and evict and discard said related data item; and
said data formatter comprising:
an input for receiving values output by said data compressor;
formatting circuitry configured to pack said output values into data packets of a fixed size, said data packets having one of a plurality of formats, each of said formats being identified by identifier bits within said data packets; and
an output for outputting said data packets; wherein
one of said plurality of formats comprises an extension format for extending a storage capacity of a data packet by storing a portion of an output value that is too large to store in said data packet, said formatting circuitry being responsive to receiving said output value that is too large to store in said data packet to divide said output value between said data packet and at least one further packet having said extension format and to output said data packet and said at least one further packet having said extension format at said output; wherein
said received values comprise at least some data compressed by a delta compressor to form delta values, and said plurality of formats include:
a first format comprising indicator values for indicating if a following packet comprises delta values relative to a predetermined value or delta values comprising data relative to a previously received data item, and at least a portion of at least one of said delta values;
a second format comprising at least a portion of at least one of said delta values; and
said extension format for storing a portion of said at least one of said delta values that are too large to store in said second format.

16. A data decompressor comprising:
an input for receiving a stream of compressed data comprising a plurality of data packets of a fixed size each storing a plurality of values, said data packets having one of a plurality of formats identified by identifier bits within each of said data packets, one of said plurality of formats comprising an extension format for storing a portion of at least one output value that is too large to store in a related data packet, wherein data packets having said extension format are immediately prior to the related data packet that they extend;
data deformatting circuitry configured to identify said formats of said data packets from said identifier bits and to combine data stored in at least one packet having said extension format with data stored in said related data packet;

data decompressing circuitry configured to decompress said compressed data, wherein at least some of said data packets comprise data compressed by a delta compressor to form delta values, and said plurality of formats include:

a first format comprising indicator values for indicating if a following packet comprises delta values relative to a predetermined value or delta values comprising data relative to a previously received data item and at least a portion of at least one of said delta values;

a second format comprising at least a portion of said delta values; and said extension format for storing a portion of said delta values that are too large to store in said second format; wherein each of said plurality of formats consists of bits dedicated to store said indicator values and bits dedicated to store at least one data field;

said data deformatting circuitry configured to extract delta values from packets of said first format, said second format and said extension format; and said data decompressing circuitry configured to form original data items from said extracted delta values and said predetermined value.

17. A method of compressing data comprising the steps of:

receiving a stream of data comprising a plurality of data items at a data input;

accessing a data store and determining if a data item related to a received data item is stored in said data store and:

in response to said related data item being stored, retrieving said related data item from said data store and calculating a delta value comprising a difference between said received data item and said related data item and outputting said delta value; and in response to said related data item not being stored in said data store calculating a delta value comprising a difference between said received data item and a predetermined value and outputting said delta value;

accessing said data store to determine if a storage location is allocated to said received data item; and if a storage location is allocated to said received data item, storing said data item in said allocated storage location; and if a storage location is not allocated to said received data item, allocating a storage location within said data store to said received data item, evicting and discarding data stored in said storage location; and storing said data item in said allocated storage location, wherein said plurality of data items in said data stream are each classified as belonging to one of a plurality of data objects, said data objects each comprising a plurality of data items, each storage location within said data store being allocated to one of said data objects and comprising an identifier identifying said data object, wherein said received data item and said related data item belong to a same data object and, in response to said related data item being stored in said data store, said received data item is stored in said storage location allocated to said related data item and said related data item is evicted and discarded.

18. A method of formatting compressed data comprising:

receiving values output by a data compressor;

packing said output values into data packets of a fixed size, said data packets having one of a plurality of formats, each of said formats being identified by identifier bits within said data packets; and outputting said data packets; wherein one of said plurality of formats comprises an extension format for extending a storage capacity of a data packet by storing a portion of at least one output value that is too large to store in said data packet, and, in response to receiving said at least one output value that is too large to store in said data packet, dividing said at least one output value between said data packet and at least one further packet having said extension format and outputting said data packet and said at least one further packet having said extension format, wherein said at least one further packet having said extension format is output immediately prior to said data packet that it extends.

19. A method of compressing data and then formatting said compressed data, said method of compressing data comprising the steps of:

receiving a stream of data comprising a plurality of data items at a data input;

accessing a data store and determining if a data item related to a received data item is stored in said data store and:

in response to said related data item being stored, retrieving said related data item from said data store and calculating a delta value comprising a difference between said received data item and said related data item and outputting said delta value; and in response to said related data item not being stored in said data store calculating a delta value comprising a difference between said received data item and a predetermined value and outputting said delta value;

accessing said data store to determine if a storage location is allocated to said received data item; and if a storage location is allocated to said received data item, storing said data item in said allocated storage location; and if a storage location is not allocated to said received data item, allocating a storage location within said data store to said received data item, evicting and discarding data stored in said storage location, and storing said data item in said allocated storage location, wherein said plurality of data items in said data stream are each classified as belonging to one of a plurality of data objects, said data objects each comprising a plurality of data items, each storage location within said data store being allocated to one of said data objects and comprising an identifier identifying said data object, wherein said received data item and said related data item belong to a same data object and, in response to said related data item being stored in said data store, said received data item is stored in said storage location allocated to said related data item and said related data item is evicted and discarded; and said method of formatting said compressed data comprising:

receiving values output by a data compressor;

packing said output values into data packets of a fixed size, said data packets having one of a plurality of formats, each of said formats being identified by identifier bits within said data packets; and outputting said data packets; wherein one of said plurality of formats comprises an extension format for extending a storage capacity of a data packet by storing a portion of at least one output value that is too large to store in said data packet, and, in response to receiving said at least one output value that is too large to store in said data packet, dividing said output value between said data packet and at least one further packet having said extension format and outputting said data packet and said at least one further packet having said extension format.

20. A method of decompressing compressed data, comprising:

receiving a stream of compressed data comprising a plurality of data packets of a fixed size each storing a plurality of values, said data packets having one of a plurality of formats, each of said plurality of formats being identified by identifier bits within said data packets, one of said plurality of formats comprising an extension format for storing a portion of at least one output value that is too large to store in a related data packet, wherein data packets in said extension format are immediately prior to the related data packet they extend;

identifying said plurality of formats of said data packets from said identifier bits; and combining data stored in at least one data packet having said extension format with data stored in said related data packet; and decompressing said compressed data, wherein at least some of said data packets comprise data compressed by a delta compressor to form delta values, and said plurality of formats include:

a first format comprising indicator values for indicating if a following packet comprises delta values relative to a predetermined value or delta values comprising data relative to a previously received data item and at least a portion of at least one of said delta values;

a second format comprising at least a portion of said delta values; and said extension format for storing a portion of said delta values that are too large to store in said second format; wherein each of said plurality of formats consists of bits dedicated to store said indicator values and bits dedicated to store at least one data field;

extracting delta values from packets of said first format, said second format and said extension format; and forming original data items from said extracted delta values and said predetermined value.

21. A computer program product including a non-transitory computer readable storage medium storing a computer program which, when run on a computer, controls the computer to perform a method of compressing data comprising the steps of:

receiving a stream of data comprising a plurality of data items at a data input;

accessing a data store and determining if a data item related to a received data item is stored in said data store and:

in response to said related data item being stored, retrieving said related data item from said data store and calculating a delta value comprising a difference between said received data item and said related data item and outputting said delta value; and in response to said related data item not being stored in said data store calculating a delta value comprising a difference between said received data item and a predetermined value and outputting said delta value;

accessing said data store to determine if a storage location is allocated to said received data item; and if a storage location is allocated to said received data item, storing said data item in said allocated storage location; and if a storage location is not allocated to said received data item, allocating a storage location within said data store to said received data item, evicting and discarding data stored in said storage location, and storing said data item in said allocated storage location, wherein said plurality of data items in said data stream are each classified as belonging to one of a plurality of data objects, said data objects each comprising a plurality of data items, each storage location within said data store being allocated to one of said data objects and comprising an identifier identifying said data object, wherein said received data item and said related data item belong to a same data object and, in response to said related data item being stored in said data store, said received data item is stored in said storage location allocated to said related data item and said related data item is evicted and discarded.

* * * * *